United States Patent
Almoric et al.

(10) Patent No.: US 7,835,065 B2
(45) Date of Patent: Nov. 16, 2010

(54) OPTICAL PACKAGES AND METHODS FOR ALIGNING OPTICAL PACKAGES

(75) Inventors: Etienne Almoric, Avon (FR); Jacques Gollier, Painted Post, NY (US); Lawrence Hughes, Corning, NY (US); Garrett Andrew Piech, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 173 days.

(21) Appl. No.: 12/200,661

(22) Filed: Aug. 28, 2008

(65) Prior Publication Data

US 2009/0190624 A1 Jul. 30, 2009

Related U.S. Application Data

(60) Provisional application No. 61/060,276, filed on Jun. 10, 2008.

(51) Int. Cl.
  *G02F 1/35* (2006.01)
  *G02F 2/02* (2006.01)
  *H01S 3/08* (2006.01)
(52) U.S. Cl. ............... 359/332; 372/22; 372/107; 359/326
(58) Field of Classification Search ......... 359/326–332; 372/21, 22, 107
See application file for complete search history.

(56) References Cited

U.S. PATENT DOCUMENTS

| 6,411,424 | B1 | 6/2002 | Raj |
| 7,457,031 | B1 | 11/2008 | Gollier |
| 7,463,664 | B2* | 12/2008 | Mizuuchi et al. ......... 372/50.11 |
| 7,646,531 | B1* | 1/2010 | Almoric et al. ............ 359/332 |
| 7,751,045 | B2* | 7/2010 | Gollier et al. ............. 356/399 |
| 2004/0233512 | A1* | 11/2004 | Fujioka et al. ............ 359/326 |
| 2004/0252733 | A1 | 12/2004 | Huang |
| 2009/0190131 | A1 | 7/2009 | Gollier et al. |
| 2010/0053571 | A1* | 3/2010 | Gollier et al. ............. 353/98 |

FOREIGN PATENT DOCUMENTS

| WO | 03/015226 A2 | 2/2003 |
| WO | 2009/097109 A1 | 8/2009 |

* cited by examiner

*Primary Examiner*—Daniel Petkovsek
(74) *Attorney, Agent, or Firm*—Kwadjo Adusei-Poku

(57) ABSTRACT

An optical package includes a semiconductor laser, a wavelength conversion device and a MEMS-actuated mirror oriented on a base module to form a folded optical pathway between an output of the semiconductor laser and an input of the wavelength conversion device. An optical assembly is located in a mechanical positioning device and the mechanical positioning device is disposed on the base module along the optical pathway such that the beam of the semiconductor laser passes through the optical assembly, is reflected by the MEMS-actuated mirror back through the optical assembly and into the waveguide portion of the wavelength conversion device. The MEMS-actuated mirror is operable to scan the beam of the semiconductor laser over the input of the wavelength conversion device. The optical assembly may be adjusted along the optical pathway with the mechanical positioning device to focus the beam into the waveguide portion of the wavelength conversion device.

17 Claims, 5 Drawing Sheets

OPTICAL PACKAGES AND METHODS FOR ALIGNING OPTICAL PACKAGES

CROSS REFERENCE TO RELATED APPLICATIONS

The present application is related to U.S. patent application Ser. No. 12/072,386 filed Feb. 26, 2008 and entitled "METHODS AND SYSTEMS FOR ALIGNING OPTICAL PACKAGES". The present application claims the priority benefit of U.S. Provisional Patent Application No. 61/060,276 filed Jun. 10, 2008 and entitled "OPTICAL PACKAGES AND METHODS FOR ALIGNING OPTICAL PACKAGES."

BACKGROUND OF THE INVENTION

The present invention generally relates to semiconductor lasers, laser controllers, optical packages, and other optical systems incorporating semiconductor lasers and wavelength conversion devices. More specifically, the present invention relates to optical packages and methods for aligning optical packages that include, inter alia, a semiconductor laser and a second harmonic generation (SHG) crystal or another type of wavelength conversion device.

BRIEF SUMMARY OF THE INVENTION

Short wavelength light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. Typically, the SHG crystal is used to generate higher harmonic waves of the fundamental laser signal. To do so, the lasing wavelength is preferably tuned to the spectral center of the wavelength converting SHG crystal and the output of the laser is preferably aligned with the waveguide portion at the input facet of the wavelength converting crystal.

Waveguide optical mode field diameters of typical SHG crystals, such as MgO-doped periodically poled lithium niobate (PPLN) crystals, can be in the range of a few microns. As a result, the present inventors have recognized that it can be very challenging to properly align and focus the beam from the laser diode with the waveguide of the SHG crystal, particularly during assembly of the optical package. Accordingly, one object of the present invention is to provide optical packages and methods for aligning components in optical packages that utilize a laser diode in conjunction with an SHG crystal or other type of wavelength conversion device to generate shorter wavelength radiation (e.g., green laser light) from a longer wavelength source (e.g., a near-infrared laser diode).

According to one embodiment shown and described herein, an optical package includes a semiconductor laser, a wavelength conversion device, a MEMS-actuated mirror, an optical assembly, a mechanical positioning device and a base module. The wavelength conversion device may include a waveguide portion. The semiconductor laser, the wavelength conversion device and the MEMS-actuated mirror are oriented on the base module to form a folded optical pathway between an output of the semiconductor laser and an input of the wavelength conversion device such that an output beam of the semiconductor laser may be reflected by the adjustable mirror into the waveguide portion of the wavelength conversion device. The MEMs-actuated mirror is operable to scan the output beam of the semiconductor laser over the input of the wavelength conversion device. The optical assembly is located in the mechanical positioning device and the mechanical positioning device is disposed on the base module along the optical pathway such that the beam of the semiconductor laser passes through the optical assembly after the beam exits the semiconductor laser and is reflected by the MEMS-actuated mirror back through the optical assembly and into the waveguide portion of the wavelength conversion device, wherein a position of the optical assembly along the optical pathway may be adjusted with the mechanical positioning device such that the beam of the semiconductor laser is focused into the waveguide portion of the wavelength conversion device.

According to another embodiment shown and described herein, a method for assembling and aligning an optical package having a semiconductor laser, a wavelength conversion device including a waveguide portion, a MEMS-actuated mirror, an optical assembly, a mechanical positioning device and a base module includes positioning the semiconductor laser, the wavelength conversion device and the MEMS-actuated mirror on the base module such that the optical pathway defined by the semiconductor laser, the MEMS-actuated mirror and the wavelength conversion device is a folded optical pathway. The optical assembly is inserted into the folded optical pathway with the mechanical positioning device such that the optical assembly is nominally aligned with the semiconductor laser, the wavelength conversion device and the MEMS-actuated mirror and an output beam of the semiconductor laser passes through the optical assembly and is reflected back through the optical assembly and into the waveguide portion of the wavelength conversion device. The output beam of the semiconductor laser is aligned with an input face of the waveguide portion of the wavelength conversion device by varying the position of the MEMS-actuated mirror. A position of the optical assembly is adjusted with the mechanical positioning device to focus the output beam of the semiconductor laser into the waveguide portion of the wavelength conversion device such that the output beam of the semiconductor laser is aligned with the waveguide portion of the wavelength conversion device and an output intensity of the wavelength conversion device is maximized.

Additional features and advantages of the invention will be set forth in the detailed description which follows and, in part, will be readily apparent to those skilled in the art from that description or recognized by practicing the invention as described herein, including the detailed description which follows, the claims, as well as the appended drawings. It is to be understood that both the foregoing general description and the following detailed description present embodiments of the invention and are intended to provide an overview or framework for understanding the nature and character of the invention as it is claimed.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
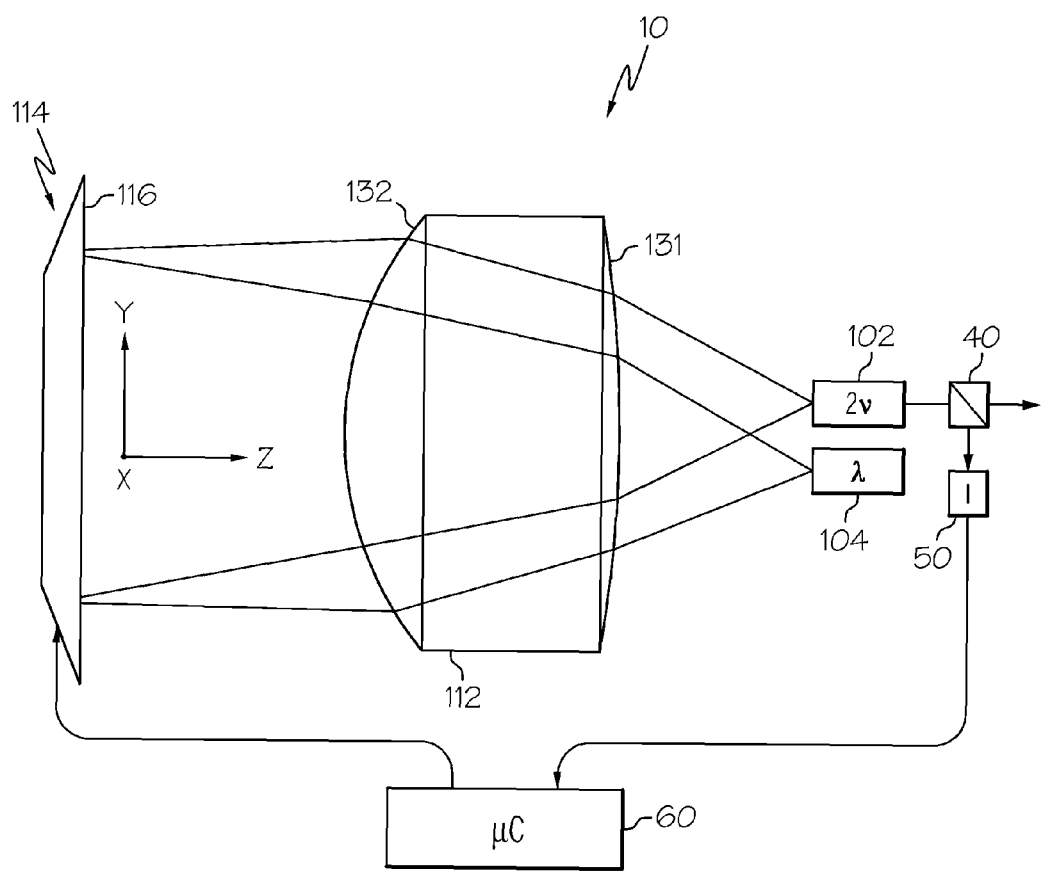
FIG. 1 is a schematic illustration of a MEMS mirror-enabled optical alignment package according to one or more embodiments shown and described herein.

Referring initially to FIG. 1, although the general structure of the various types of optical packages in which the concepts of particular embodiments of the present invention can be incorporated is taught in readily available technical literature relating to the design and fabrication of frequency or wavelength-converted semiconductor laser sources, the concepts of particular embodiments of the present invention may be conveniently illustrated with general reference to an optical package 10 including, for example, a semiconductor laser 104 (labeled "λ" in FIG. 1) and a wavelength conversion device 102 (labeled "2v" in FIG. 1). In the configuration depicted in FIG. 1, the near infrared light emitted by the semiconductor laser 104 is coupled into a waveguide portion of the wavelength conversion device 102 by one or more adjustable optical components, such as a MEMS-actuated mirror 114, and a suitable optical assembly 112, which optical assembly 112 may comprise one or more optical elements (e.g., lenses) of unitary or multi-component configuration. The optical package 10 illustrated in FIG. 1 is particularly useful in generating a variety of shorter wavelength laser beams from a variety of longer wavelength semiconductor lasers and can be used, for example, as a visible laser source in a laser projection system.

The adjustable optical component is particularly helpful because it is often difficult to align and focus the output beam emitted by the semiconductor laser 104 into the waveguide portion of the wavelength conversion device 102. For example, waveguide optical mode field diameters of typical SHG crystals, such as MgO-doped periodically poled lithium niobate (PPLN) crystals, can be in the range of a few microns. Referring to FIG. 1, the optical assembly 112 cooperates with the MEMS-actuated mirror 114 to direct a beam of the semiconductor laser 104 into waveguide portion of the wavelength conversion device 102 and, more specifically, into the waveguide portion of the wavelength conversion device 102. The MEMS-actuated mirror 114 is operable to introduce beam angular deviation by adjusting a position or state of the mirror 116 and, as such, can be used to actively align the beam of the semiconductor laser 104 with the waveguide portion of the wavelength conversion device 102 in the x-y plane by altering the position of the beam on the wavelength conversion device 102 until it is aligned with the waveguide portion of the wavelength conversion device 102.

In one embodiment, beam alignment may be monitored by providing, for example, a beam splitter 40 and an optical detector 50 in the optical path of the wavelength conversion device 102. The optical detector 50 may be operably connected to a microcontroller or controller 60 (labeled "μc" in FIG. 1) such that an output signal from the optical detector 50 is received by the controller 60. The controller 60 may be configured to control the position or state of the MEMS-actuated mirror 114 by adjusting the MEMS actuator(s) and, as such, position the output beam of the semiconductor laser 104 on the wavelength conversion device 102. In one embodiment the controller 60 may be used to control the position or state of the MEMS-actuated mirror 114 as a function of the output signal received from the optical detector 50. In another embodiment, the controller 60 may be used to perform an alignment routine such that the output beam of the semiconductor laser 104 is aligned with the waveguide portion 24 of the wavelength conversion device 102.

As described herein, the adjustable optical component may comprise a MEMS-actuated mirror 114, such as when the adjustment mechanism operatively associated with the mirror 116 comprises one or more micro-opto-electromechanical systems (MOEMS) or micro-electro-mechanical systems (MEMS) operatively coupled to a mirror 116. The MEMS or MOEMS devices may be configured and arranged to vary the position of the output beam of the semiconductor laser 104 on the wavelength conversion device 102 in the x-y plane. Because the mirror is located in the collimated or nearly-collimated beam space of the optical assembly 112, adjustment of the mirror angle will result in a change in the x/y position of the refocused beam on the wavelength conversion device. Use of a MOEMS or MEMS-actuated mirror enables adjustment of the refocused beam position to be done extremely rapidly over large ranges. For example, a MEMS-actuated mirror with ±1 degree of mechanical deflection, when used in conjunction with an optical assembly having a 3 mm focal length, may allow the beam to be angularly displaced ±100 μm on the wavelength conversion device. The adjustment and/or repositioning of the beam may be done at frequencies on the order of 100 Hz to 10 kHz due to the fast response time of the MOEMS or MEMS-actuated mirror.

While specific reference has been made herein to the adjustable optical component being a MEMS-actuated mirror 114, it should be understood that the adjustable optical component may take a variety of conventional or yet to be developed forms. For example, the adjustable optical component may comprise one or more liquid lens components configured for beam steering and/or beam focusing. Still further, it is contemplated that the adjustable optical component may comprise one or more mirrors and/or lenses mounted to micro-actuators. In one contemplated embodiment, the adjustable optical component takes the form of a movable or adjustable lens in the optical assembly 112 and the otherwise adjustable optical component takes the form of a fixed mirror.

In the optical configuration illustrated in FIG. 1, the adjustable optical component is a MEMS-actuated mirror incorporated in a relatively compact, folded-path optical configuration. As shown in FIG. 1, the MEMS-actuated mirror 114 may be configured to fold the optical path such that the optical path of the output beam of the semiconductor laser 104 initially passes through the optical assembly 112 to reach the MEMS-actuated mirror 114 as a collimated or nearly collimated beam and subsequently returns through the same optical assembly 112 to be focused on the wavelength conversion device 102. In this configuration, the optical path is "folded" as the output beam of the semiconductor laser is initially directed through the optical assembly 112 and then reflected back through the same optical assembly 112. This type of optical configuration is particularly applicable to wavelength converted laser sources where the cross-sectional size of the laser beam generated by the semiconductor laser is close to the size of the waveguide on the input face of the wavelength conversion device 102, in which case a magnification close to one would yield optimum coupling in focusing the output beam on the wavelength conversion device 102. For the purposes of defining and describing the present invention, it is noted that reference herein to a "collimated or nearly collimated" beam is intended to cover any beam configuration where the degree of beam divergence or convergence is reduced, directing the beam towards a more collimated state.

The optical assembly 112 can be described as a dual function, collimating and focusing optical component or lens because it serves to collimate the divergent light output of the semiconductor laser 104 and then refocus the laser light propagating along the optical path of the optical package 10 into the waveguide portion of the wavelength conversion device. This dual function optical component is well suited for applications requiring magnification factors close to one because a single optical assembly 112 is used for both collimation and focusing. More specifically, as is illustrated in FIG. 1, the output beam of the semiconductor laser 104 is, in sequence, refracted at the first face 131 of the optical assembly 112, refracted at the second face 132 of the optical assembly 112, and reflected by the MEMS-actuated mirror 114 in the direction of the optical assembly 112. Once the laser light is reflected back in the direction of the optical assembly 112, it is first refracted at the second face 132 of the optical assembly 112 and subsequently refracted at the first face 131 of the optical assembly 112 and directed into the waveguide portion of the wavelength conversion device 102.

In particular embodiments of the present invention, the MEMS-actuated mirror 114 may be placed close enough to the image focal point of the optical assembly 112 to ensure that the principle ray incident on the input face of the wavelength conversion device 102 is approximately parallel to the principle ray at the output of the optical package 10. It may also be shown that the configuration illustrated in FIG. 1 also presents some advantages in terms of aberration. Indeed, when the output face of the semiconductor laser 104 and the input face of the wavelength conversion device 102 are positioned in approximate alignment with the object focal plane of the optical assembly 112 and the output waveguide of the semiconductor laser 104 and the input waveguide of the wavelength conversion device 102 are symmetric with respect to the optical axis of the optical assembly 112, it is contemplated that anti symmetric field aberrations, such as coma, can be automatically corrected.

While reference has been made herein to FIG. 1 to describe the general orientation of the components of the optical package 10, specific reference will now be made to FIGS. 2-7 to further describe the orientation, assembly, and alignment of the optical package and, more specifically, structures and methods for aligning and focusing the beam of the semiconductor laser into the waveguide portion of the wavelength conversion device.

Figure 2:
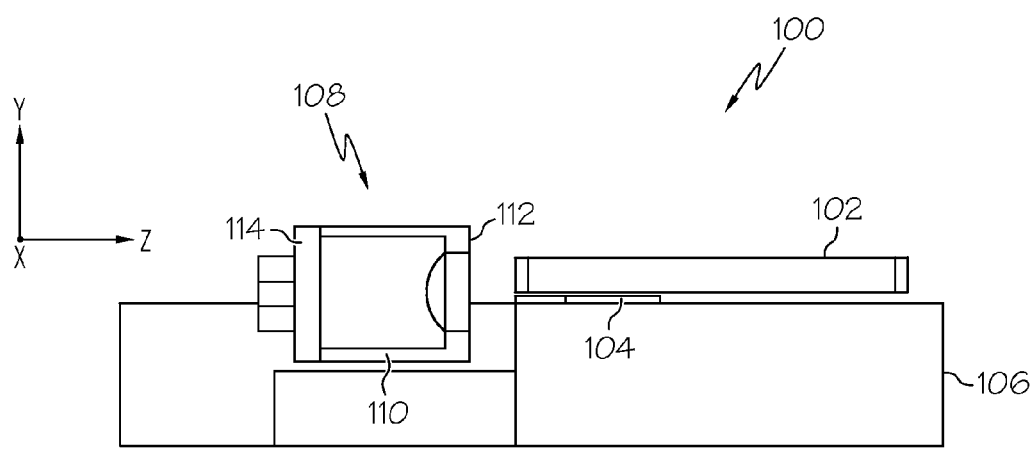
FIG. 2 is a cross sectional view of an optical package according to one or more embodiments shown and described herein.
Figure 3:
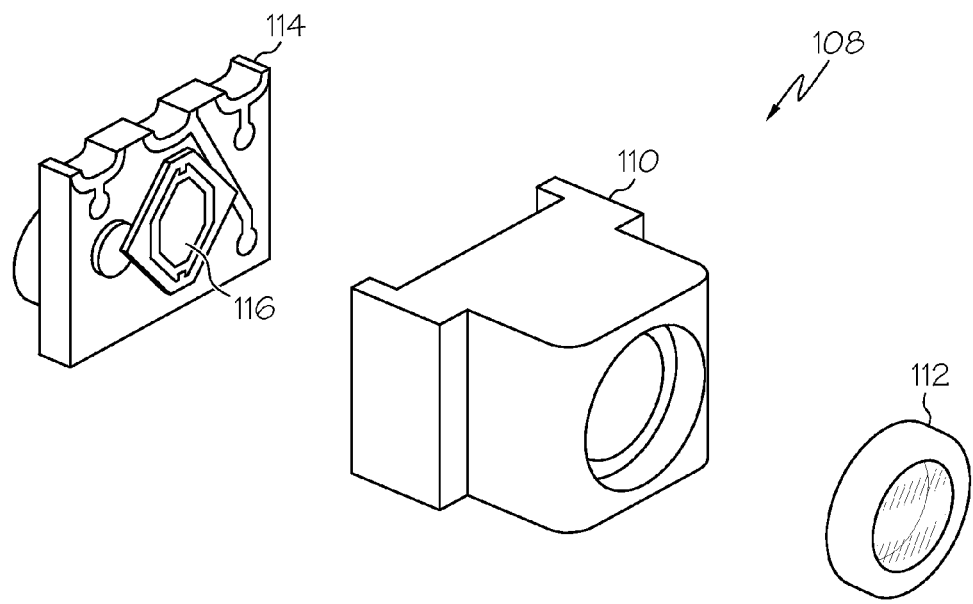
FIG. 3 is an exploded view of an optical assembly holder and optical assembly according to one or more embodiments shown and described herein.

Referring now to FIGS. 2 and 3, one embodiment of an optical package 100 is shown. In this embodiment, the semiconductor laser 104 and the wavelength conversion device 102 are in a stacked configuration and mounted atop a base module 106. In this embodiment, the MEMS-actuated mirror 114 is positioned on the base module 106 and oriented such that the mirror portion is opposed to the output of the semiconductor laser 104 and the input of the wavelength conversion device 102. More specifically, the MEMS-actuated mirror is oriented on the base module such that a normal to the surface of the mirror 116 is parallel to the optical axis of both the semiconductor laser 104 and the wavelength conversion device 102 when the mirror of the MEMS-actuated mirror is in a neutral position (e.g., without any tip or tilt applied to the mirror by the MEMS actuator). Specifically referring to the coordinate system shown in FIG. 2, when the MEMS-actuated mirror 114 is positioned in this orientation, the surface of the mirror 116 is substantially co-planar with the x-y plane. However, it will be understood that, when the MEMS-actuated mirror is adjusted, the mirror may tip and tilt in and out of the x-y plane about axes of rotation parallel to the x-axis and the y-axis.

It should now be understood that, while FIG. 2 shows the semiconductor laser 104 and the wavelength conversion device 102 in a vertically stacked configuration, the semiconductor laser 104 and the wavelength conversion device 102 may also be oriented in a side-by-side configuration which may also yield a folded optical pathway as described herein.

The base module 106 may generally comprise electrical interconnects (not shown) such that, when the MEMS-actuated mirror 114 is positioned on the base module 106, the corresponding electrical interconnects of the MEMS-actuated mirror 114 may be electrically coupled to the electrical interconnects of the base module 106 without requiring additional processing (e.g., welding, soldering, etc.). However, in another embodiment, the electrical interconnects between the MEMS-actuated mirror 114 and the base module are created using wire, welding, soldering and/or combinations thereof.

In the embodiment shown in FIGS. 2 and 3, the optical element 112 may be positioned in a mechanical positioning device. In the embodiment shown in FIGS. 2 and 3, the mechanical positioning device comprises an optical assembly holder 110 in which the optical assembly 112 may be positioned. The optical assembly holder 110 and optical assembly 112 are then positioned on the base module 106 such that the optical element is disposed in the optical pathway between the semiconductor laser 104 and wavelength conversion device 102 and the MEMS-actuated mirror 114. In one embodiment, the optical assembly 112 is integrally formed with the optical assembly holder 110. In another embodiment, the optical assembly 112 and the optical assembly holder 110 are discrete components, as shown in FIG. 3, and the optical assembly 112 is inserted in the optical assembly holder 110 and fixed in position. The optical assembly holder 110 may comprise a material with a suitable coefficient of thermal expansion so as to minimize the effects of thermal expansion on the optical alignment of the optical package during operation of the optical package. In another embodiment, the optical assembly holder 110 may comprise a material with a suitable coefficient of thermal expansion so as to fully or partially compensate for the effects of thermal expansion during operation of the optical package.

In one embodiment, the optical assembly holder 110 may comprise one or more positioning features (not shown) and the base module 106 may comprise a plurality of locating features (not shown) generally corresponding to the positioning features of the optical assembly holder. For example, the positioning features of the optical assembly holder may include, without limitation, pins, posts, slots, channels, dovetails, holes, grooves and/or combinations thereof. Similarly, the locating features of the base module 106 may comprise the corresponding part to the positioning features of the optical assembly holder 110 such as grooves, holes, channels, dovetail slots, posts, pins and/or combinations thereof.

The optical assembly holder 110 may be adjustably positioned on the base module 106 between the MEMS-actuated mirror and the semiconductor laser 104/wavelength conversion device 102 such that the optical assembly 112 is positioned in the optical pathway. The optical assembly holder 110 may be positioned by connecting the positioning features of the optical assembly holder 110 with the corresponding locating features of the base module 106. In this manner the position of the optical assembly holder 110 and optical assembly 112 may be precisely controlled in the z-direction with respect to the base module 106 and the folded optical pathway defined by the MEMS-actuated mirror 114, the semiconductor laser 104 and the wavelength conversion device 102. The adjustability of the optical assembly holder 110 and, more specifically, the optical assembly 112, in the z-direction facilitates focusing the output beam of the semiconductor laser 104 into the waveguide portion of the wavelength conversion device 102.

In another embodiment, the optical assembly holder 110 may be configured such that the optical assembly holder 110 may be attached to the MEMS-actuated mirror 114 thereby aligning the MEMS-actuated mirror with the optical assembly 108 as is shown in FIGS. 2-3. When the optical assembly holder 110 and optical assembly 112 are attached to the MEMS-actuated mirror 114, the combination may be referred to as a MEMS-lens unit or MEMSLU 108.

In order to assemble the optical package 100 shown in FIG. 2, the semiconductor laser 104 and wavelength conversion device 102 are first mounted on the base module 106 using standard mounting techniques for assembling electronic and/or electro-optic devices. For example, in one embodiment, a microscope and camera may be used to identify the output of the semiconductor laser 104 and the waveguide portion of the wavelength conversion device 102 and align them with one another such that the output of the semiconductor laser 104 and the waveguide portion of the wavelength conversion device 102 lie in the same vertical plane along the z-axis (e.g., the output of the semiconductor laser 104 and the waveguide portion of the wavelength conversion device lie in a y-z plane). Because the wavelength conversion 102 device may generally comprise a transparent optical material such as, for example, lithium niobate and the wavelength conversion device 102 is positioned on top of the semiconductor laser 104, a camera or microscope may be used to view the wavelength conversion device 102 and semiconductor laser 104 from about the wavelength conversion device and thereby assist in positioning and alignment. The semiconductor laser 104 and the wavelength conversion device 102 may be attached to the base module 106 with epoxy, glue, solder or other conventional attachment methods.

In one embodiment, when the optical assembly 112 is not integral with the optical assembly holder 110, the optical assembly 112 may be inserted into the optical assembly holder 110 and fixed into place with adhesive, solder, frit or mechanical attachments such as screws, clips or the like. The optical assembly holder 110 is then attached to the MEMS-actuated mirror using adhesive, solder, frit or mechanical attachments such as screws, clips or the like to form the MEMSLU 108.

The assembled MEMSLU 108 is positioned on the base module 106 such that the mirror 116 of the MEMS-actuated mirror 114 is facing the output of the semiconductor laser 104 and temporary electrical interconnects are attached to the MEMS-actuated mirror 114 thereby coupling the MEMS-actuated mirror to the controller (not shown) and a power source (not shown) of the optical package. The MEMSLU 108 is generally aligned with the semiconductor laser such that the optical assembly 112 is positioned in the optical pathway of the output beam of the semiconductor laser. The MEMSLU 108 may be mechanically held in place on the base module 106. In one embodiment, this may be accomplished using the positioning features on optical assembly holder 110 of the MEMSLU 108 in conjunction with the corresponding locating features on the base module 106. The optical package is then powered on and the MEMS-actuated mirror 114 performs an alignment routine under the control of the controller (e.g., the microcontroller 60 shown in FIG. 1) in order to locate and align the beam of the semiconductor laser 104 with the waveguide portion of the wavelength conversion device 102 in the x-y plane. The alignment routine generally comprises scanning the output beam of the semiconductor laser 104 over the input face of the wavelength conversion device 102 in the x-y plane by adjusting the position of the mirror of the MEMS-actuated mirror. As the output beam is scanned over the wavelength conversion device 102, the output intensity of the wavelength conversion device may be monitored using an optical detector coupled to the controller as shown in FIG. 1. The optimum alignment of the output beam with the waveguide may be determined by the controller using feedback from the optical detector. For example, when the output intensity of the wavelength conversion device reaches a maximum, the output beam of the semiconductor laser is generally aligned with the waveguide portion of the wavelength conversion device in the x-y plane. Accordingly, the position of the mirror of the MEMS-actuated mirror corresponding to the maximum output intensity should generally produce alignment between the semiconductor laser and the wavelength conversion device.

In one particular embodiment, the method used to align the output beam of the semiconductor laser with the waveguide portion of the wavelength conversion device in the x-y plane may be the method disclosed in U.S. patent application Ser. No. 12/072,386 filed Feb. 26, 2008 and entitled "METHODS AND SYSTEMS FOR ALIGNING OPTICAL PACKAGES," although other methods may be used as will be apparent to one skilled in the art, including, without limitation, raster scanning and the like. Such methodologies will generally yield alignment of the output beam of the semiconductor laser with the waveguide portion of the wavelength conversion device in the x-y plane.

With the output beam of the semiconductor laser 104 aligned with the waveguide portion of the wavelength conversion device 102 in the x-y plane, the position of the MEMSLU 108 is adjusted in the z-direction such that the output beam of the semiconductor laser 104 is focused into the waveguide portion of the wavelength conversion device 102. As the position of the MEMSLU 108 is adjusted in the z-direction, the controller of the optical package continuously runs an adaptive waveguide alignment algorithm (e.g., the controller varies the position of the mirror 116 of the MEMS-actuated mirror 114) so as to optimize the position of the output beam of the semiconductor laser 104 in the x-y plane on the waveguide portion of the wavelength conversion device and thereby achieve and/or maintain peak coupling of the output beam with the waveguide portion of the wavelength conversion device as the output beam is focused.

Once peak coupling between the semiconductor laser 104 and the wavelength conversion device is obtained (e.g., the output of the wavelength conversion device is optimized and/or the desired output intensity of the wavelength conversion device is achieved, including, without limitation, the maximum output intensity), the controller determines the optimum position or deflection of the mirror 116 of the MEMS-actuated mirror 114 based on the electronic signals used to drive the mirror during alignment. Using this information, the MEMS-actuated mirror 114 is adjusted to utilize electronic drive signals requiring minimum power consumption to achieve and maintain the optimum coupling position of the mirror 116. Thereafter the MEMS-actuated mirror is fixed into place using adhesive, solder and/or welding and permanent electrical interconnects are attached to the MEMS-actuated mirror 114 using wires, solder, adhesive or the like.

Figure 4:
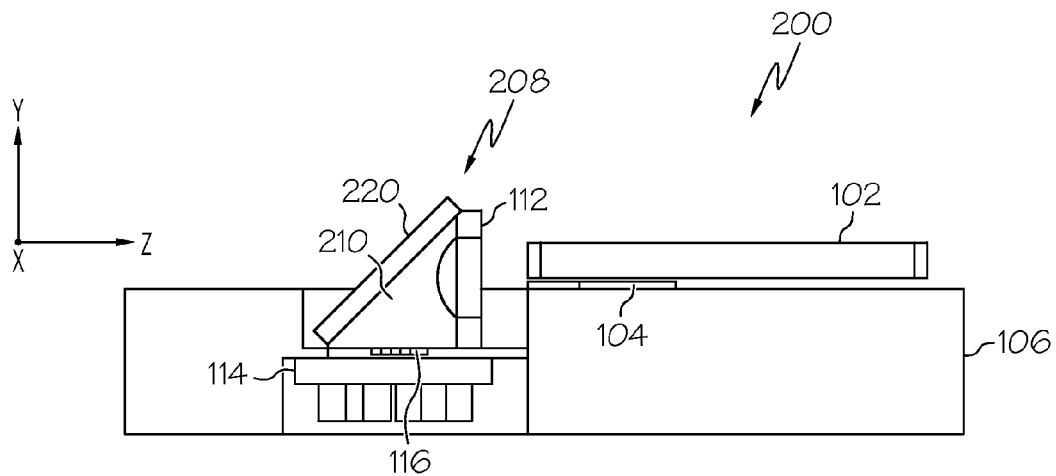
FIG. 4 is a cross sectional view of an optical package according to one or more embodiments shown and described herein.
Figure 5:
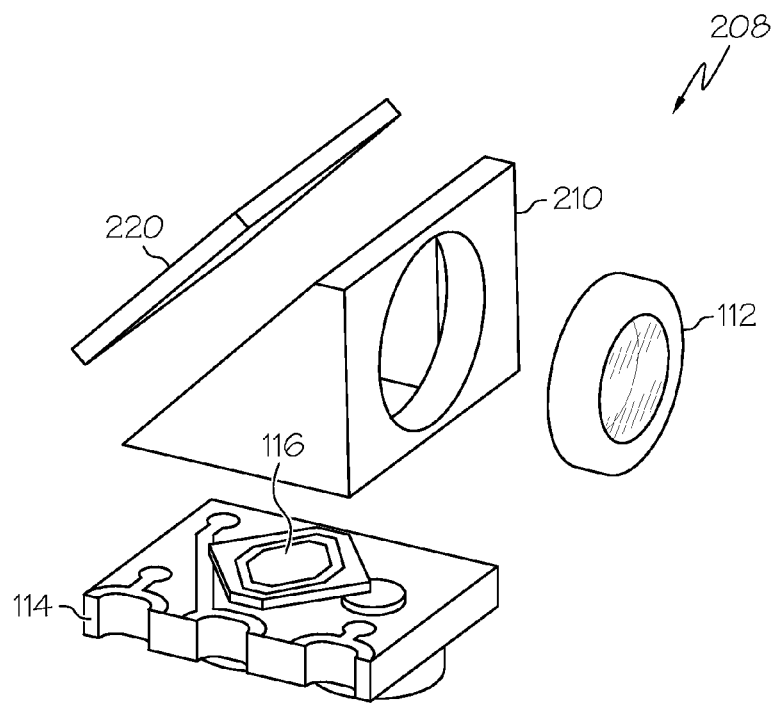
FIG. 5 is an exploded view of an optical assembly holder, optical assembly and fold mirror according to one or more embodiments shown and described herein.

Referring now to FIGS. 4 and 5, another embodiment of an optical package 200 is shown. As discussed hereinabove, the semiconductor laser 104 and the wavelength conversion device 102 are in a stacked configuration and mounted atop the base module 106. However, in this embodiment of the optical package 200, the MEMS-actuated mirror 114 is positioned horizontally on the base module 106. More specifically, the MEMS-actuated mirror 114 is oriented on the base module 106 such that a normal to the surface of the mirror 116 is perpendicular to the optical axis of both the semiconductor laser 104 and the wavelength conversion device 102 when the mirror of the MEMS-actuated mirror is in a neutral position (e.g., without any tip or tilt applied to the mirror by the MEMS actuator). Specifically referring to the coordinate system shown in FIG. 4, when the MEMS-actuated mirror 114 is positioned in this orientation, the surface of the mirror 116 is substantially co-planar with the x-z plane. However, it will be understood that, when the MEMS-actuated mirror is adjusted, the mirror may tip and tilt in and out of the x-z plane about axes of rotation parallel to the x-axis and the z-axis.

In one embodiment, the MEMS-actuated mirror 114 may be positioned on the base module 106. In another embodiment, the base module 106 may comprise a receptacle (not shown) for receiving the MEMS-actuated mirror 114 such that, when the MEMS-actuated mirror 114 is positioned in the receptacle, the MEMS-actuated mirror 114 is recessed in the base module 106. In either embodiment, the base module may generally comprise electrical interconnects (not shown) such that, when the MEMS-actuated mirror is positioned on the base module 106, the corresponding electrical interconnects of the MEMS-actuated mirror may be electrically coupled to the electrical interconnects of the base module 106, as discussed hereinabove.

In the embodiment of the optical package 200 shown in FIG. 4, the optical assembly 112 may be positioned in an optical assembly holder 210 as generally described above with respect to FIGS. 2 and 3. The optical assembly 112 may be integral with the optical assembly holder or may be a separate component inserted in the optical assembly holder 210 as shown in FIG. 5. However, in the embodiment of the optical package 200 shown in FIGS. 4 and 5, the optical package 200 also comprises a fold mirror 220. In one embodiment, the fold mirror 220 may be a separate fixed mirror positioned in the optical pathway of the optical package 200. In another embodiment, the optical assembly holder 210 may be integrally formed with the fold mirror 220. In yet another embodiment, the fold mirror 220 may be a discrete component attached to the optical assembly holder 210. For example, in the embodiment shown in FIGS. 4 and 5, the optical assembly 112 and the fold mirror 220 are discrete components attached to the optical assembly holder 210 thereby forming a mirror-lens unit (MLU) 208.

The fold mirror 220 is generally oriented such that the output beam of the semiconductor laser 104 is incident on the fold mirror 220 and reflected onto the MEMS-actuated mirror 114. For example, in the embodiment shown in FIG. 4, the fold mirror 220 is attached to the optical assembly holder 210 such that the surface of the mirror is at a 45 degree angle to the output beam of the semiconductor laser 104 when the MLU 208 is positioned over the MEMS-actuated mirror 114. In this configuration the output beam of the semiconductor laser 104 may be redirected by 90 degrees by the fold mirror 220. Tracing the optical pathway of the output beam, the output beam of the semiconductor laser 104 first passes through the optical assembly 212, is reflected by the fold mirror 220 onto the MEMS-actuated mirror 114, reflected by the MEMS-actuated mirror 114 back onto the fold mirror 220, reflected by the fold mirror 220 back through the optical assembly 212 and focused into the waveguide portion of the wavelength conversion device 102. However, it should be understood that, while FIG. 4 generally shows the optical assembly 112 being disposed between the semiconductor laser 104 and the fold mirror 220, the optical assembly may be alternatively disposed between the fold mirror and the MEMS-actuated mirror 114.

In one embodiment, the optical assembly holder 210 may comprise one or more positioning features (not shown) and the base module 106 may comprise a plurality of locating features (not shown) generally corresponding to the positioning features of the optical assembly holder, as described hereinabove with respect to the embodiment of the optical package 100 shown in FIG. 2. For example, the optical assembly holder 210 may be adjustably positioned on the base module 106 over the MEMS-actuated mirror 114 by connecting the positioning features of the optical assembly holder 210 with the corresponding locating features of the base module 106. In this manner the position of the optical assembly holder 210 and optical assembly 112 may be precisely controlled in the z-direction with respect to the base module 106 and the optical pathway defined by the MEMS-actuated mirror 114, the semiconductor laser 104 and the wavelength conversion device 102. The adjustability of the optical assembly holder 210 and, more specifically, the optical assembly 112, in the z-direction facilitates focusing the output beam of the semiconductor laser 104 into the waveguide portion of the wavelength conversion device 102.

The use of the horizontally oriented MEMS-actuated mirror 114 and the fold mirror 220 of the optical package 200 shown in FIG. 4 may be used to compensate for astigmatism introduced in the system by the optical assembly 112. For example, the 45 degree orientation of the fold mirror 220 may be used in conjunction with a fold mirror having a curved surface to introduce astigmatism which will offset or counteract the astigmatism produced by the optical assembly 112. For example, an optimum curvature of the fold mirror 220 may be calculated such that the astigmatism produce by the fold mirror 220 mitigates the astigmatism introduced by the optical assembly 112 thereby improving the optical quality of the beam as it traverses the folded optical pathway.

The embodiment of the optical package 300 may be assembled and aligned by first attaching the semiconductor laser 104 and the wavelength conversion device 102 to the base module 106 and discussed hereinabove. The MEMS-actuated mirror 114 is attached to the base module 106 using adhesive, solder, or mechanical attachments such as screws, clips or the like. The MEMS-actuated mirror 114 is then electrically interconnected to the base module 106 using wires, solder, adhesive or the like (provided the electrical interconnects are not formed when the MEMS-actuated mirror 114 is inserted into the base module 106). The optical assembly 112 is then inserted into the optical assembly holder 210 and fixed in place with adhesive, frits, or mechanical attachments such as screws, clips or the like. The folding mirror is then attached to the optical assembly holder 210.

The optical assembly holder 210 is positioned in front of the semiconductor laser and over the MEMS-actuated mirror 114 and generally aligned with each component in the x, y and z directions. The optical package is then powered on and an alignment routine is performed under the control of the controller (not shown), as described hereinabove, to establish alignment of the output beam of the semiconductor laser with the waveguide portion of the wavelength conversion device in the x-y plane. Thereafter, the position of the MLU 208 is adjusted in the z-direction to focus the output beam of the semiconductor laser into the waveguide portion of the wavelength conversion device. Active alignment of the output beam with the waveguide portion as the MLU 208 is adjusted in the z-direction until optimum coupling is achieved between the output beam of the semiconductor laser 104 and the waveguide portion of the wavelength conversion device. Once optimum coupling is achieved (e.g., the output intensity of the wavelength conversion device reaches a desired level, including, without limitation, the maximum output intensity), the optical assembly holder 210 is fixed into place on the base module 106 using welding, soldering, adhesive and/or combinations thereof.

Figure 6:
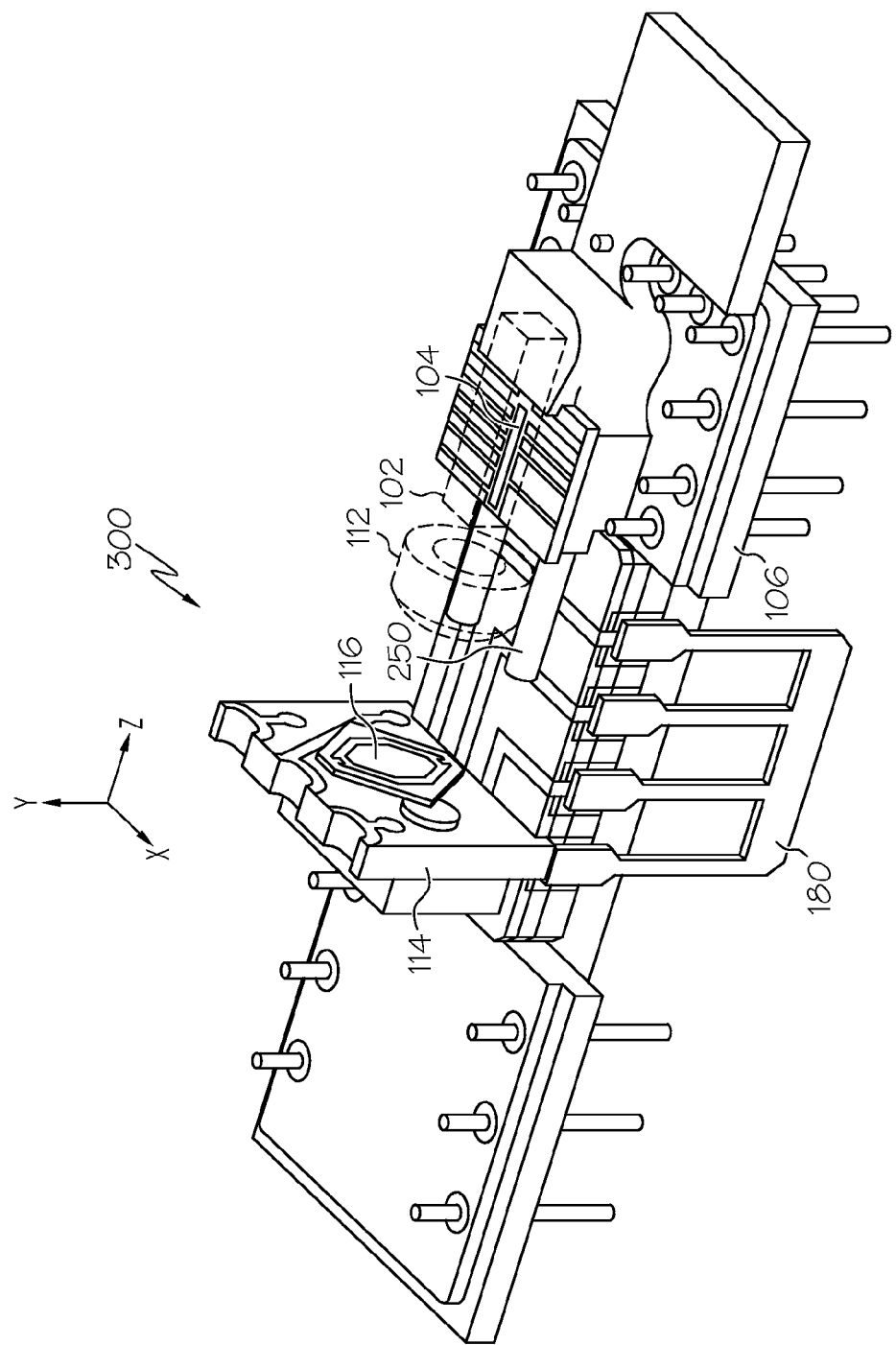
FIG. 6 is a schematic illustration of an optical package with a vertically oriented MEMS-actuated mirror according to one or more embodiments shown and described herein.

Referring now to FIG. 6, another embodiment of an optical package 300 is shown. In this embodiment, the semiconductor laser 104 and the wavelength conversion device 102 are in a stacked configuration and mounted atop the base module 106 as discussed hereinabove with respect to FIGS. 2 and 4. As shown in FIG. 6, the MEMS-actuated mirror 114 is vertically oriented as discussed herein above with respect to FIG. 3. Accordingly, the MEMS-actuated mirror is oriented on the base module such that a normal to the surface of the mirror 116 is parallel to the optical axis of the semiconductor laser 104 and the wavelength conversion device 102 when the mirror of the MEMS-actuated mirror is in a neutral position (e.g., without any tip or tilt applied to the mirror by the MEMS actuator). Specifically referring to the coordinate system shown in FIG. 6, in this orientation, the surface of the mirror 116 is substantially co-planar with the x-y plane. However, it will be understood that, when the MEMS-actuated mirror is adjusted, the mirror may tip and tilt in and out of the x-y plane about axes of rotation parallel to the x-axis and the y-axis.

The base module 106 may generally comprise electrical interconnects 180 such that, when the MEMS-actuated mirror is positioned on the base module 106, the corresponding electrical interconnects of the MEMS-actuated mirror (not shown) may be electrically coupled to the electrical interconnects 180 of the base module 106.

In the embodiment shown in FIG. 6 the optical package 300 comprises a mechanical positioning device for locating and positioning the optical assembly 112. The mechanical positioning device may comprise pins, a v-grooves, channels, slots or similar feature(s) for locating the optical assembly 112. In the embodiment of the optical package 300 shown in FIG. 6, the mechanical positioning device comprises a pair of pins 250 operatively attached to the base module 106. The optical assembly 112 may be positioned in between the pins 250 such that the optical assembly 112 is disposed in the optical pathway between the semiconductor laser 104 and the MEMS-actuated mirror 114 and between the MEMS-actuated mirror 114 and the wavelength conversion device 102. The position of the optical assembly 112 along the pins 250 may be adjusted in the z-direction such that the output beam of the semiconductor laser 104 may be focused into the waveguide portion of the wavelength conversion device.

Figure 7:
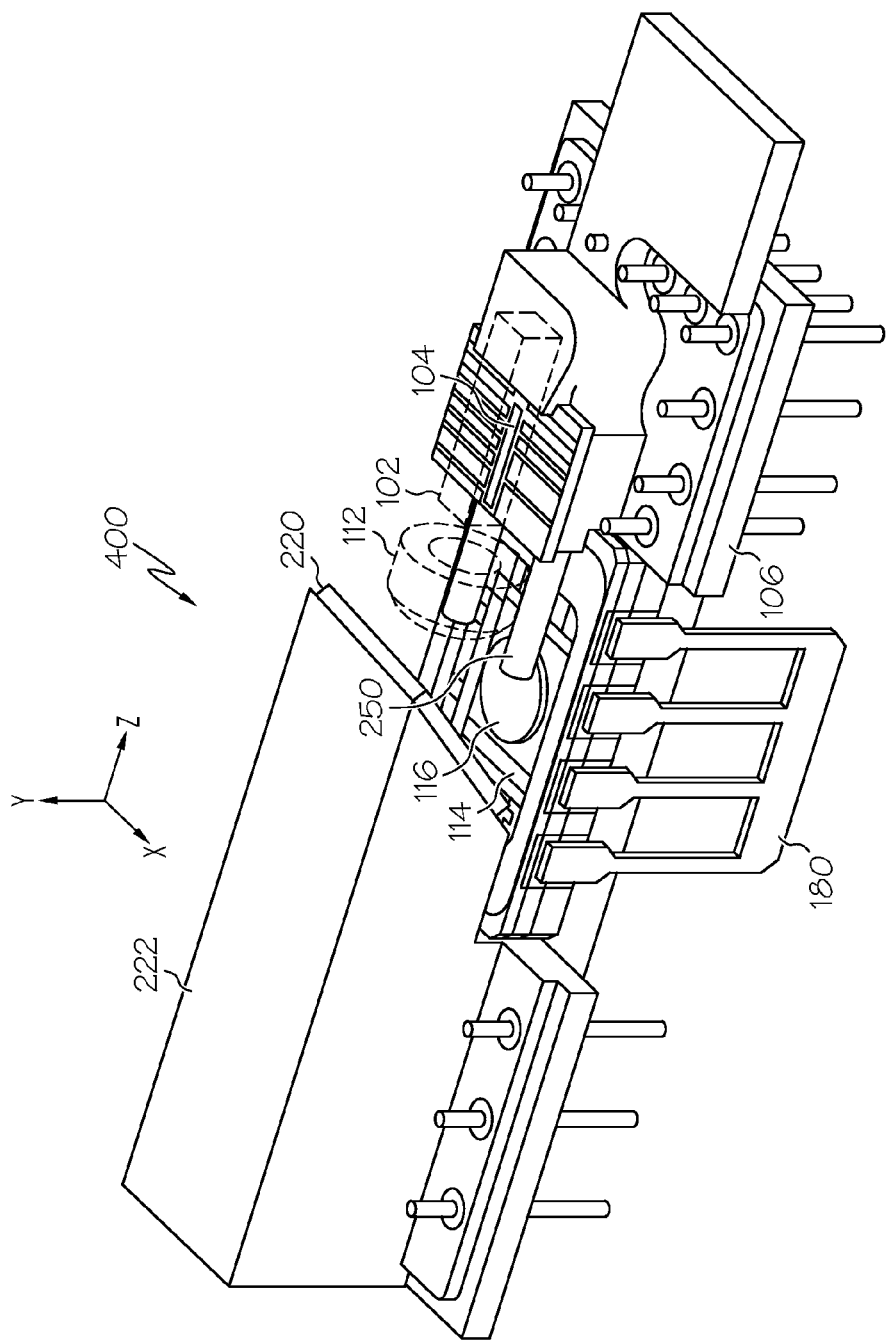
FIG. 7 is a schematic illustration of an optical package with a horizontally oriented MEMS-actuated mirror according to one or more embodiments shown and described herein.

Referring now to FIG. 7, another embodiment of the optical package 400 is shown. In this embodiment, the semiconductor laser 104 and the wavelength conversion device 102 are in a stacked configuration and mounted atop the base module 106 as discussed hereinabove with respect to FIG. 6. As shown in FIG. 7, the MEMS-actuated mirror 114 is horizontally oriented as discussed herein above with respect to FIG. 4. Accordingly, the MEMS-actuated mirror is oriented on the base module 106 such that a normal to the surface of the mirror 116 is perpendicular to the optical axis of the semiconductor laser 104 and the wavelength conversion device 102 when the mirror of the MEMS-actuated mirror is in a neutral position (e.g., without any tip or tilt applied to the mirror by the MEMS actuator). Specifically referring to the coordinate system shown in FIG. 7, in this orientation, the surface of the mirror 116 is substantially co-planar with the x-z plane. However, it will be understood that, when the MEMS-actuated mirror is adjusted, the mirror may tip and tilt in and out of the x-z plane about axes of rotation parallel to the x-axis and the z-axis.

The base module 106 may generally comprise electrical interconnects 180 such that, when the MEMS-actuated mirror is positioned on the base module 106, the corresponding electrical interconnects of the MEMS-actuated mirror (not shown) may be electrically coupled to the electrical interconnects 180 of the base module 106. The base module 106 also generally comprises a mechanical positioning device for positioning the optical assembly 112 in the optical pathway as discussed hereinabove with respect to the embodiment of the optical package 300 shown in FIG. 6. Specifically, the mechanical positioning device comprises a pair of pins 250 operatively attached to the base module 106. The pins 250 may facilitate positioning the optical assembly 112 in the z-direction so that the focus of the output beam of the semiconductor laser into the waveguide portion of the wavelength conversion device 102 may be optimized.

As noted herein, the MEMS-actuated mirror 114 is oriented in the x-z plane in the embodiment of the optical package shown in FIG. 7. Accordingly, in order to direct the output beam of the semiconductor laser 104 onto the MEMS-actuated mirror 114, the optical package 400 also comprises a fold mirror 220. The fold mirror 220 is generally positioned in the optical pathway at a 45 degree angle to the output beam of the semiconductor laser 104 such that the output beam is reflected 90 degrees and onto the MEMS-actuated mirror, as is generally described herein with respect to the embodiment of the optical package 200 shown in FIG. 4. In the embodiment of the optical package 400 shown in FIG. 7, the fold mirror 220 may be positioned on the base module 106 using a support 222. In one embodiment, the fold mirror 220 is attached to the support 222. In another embodiment, the support 222 is integrally formed with the fold mirror 220. Alternatively, the optical package 400 may further comprise a package cover (not shown) and the fold mirror may be attached to, or integrally formed with, the underside of the package cover. In either situation, the fold mirror 220 may be positioned on the base module such that the fold mirror 220 has the proper orientation for redirecting the output beam of the semiconductor laser 104 to and from the MEMS-actuated mirror 114.

In practice, the optical packages 300, 400 shown in FIGS. 6 and 7 may be assembled in the following manner. The semiconductor laser 104 and wavelength conversion device 102 are assembled onto the base module 106 and fixed into place using conventional mounting techniques for assembling electronic and/or electro-optic components. The MEMS-actuated mirror 114 is attached to the base module 106 using adhesive, solder, or a mechanical attachment including, without limitation, screws, clips, brackets or the like. The MEMS-actuated mirror 114 is then electrically interconnected to the base module 106 (when the electrical interconnects are not integrated in the base module) by wiring, soldering, adhesives or similar forms of electrical attachment. If the MEMS-actuated mirror 114 is horizontally oriented, as shown in FIG. 7, the fold mirror may be temporarily positioned on the base module with a vacuum holder, a mechanical holder and/or an adhesive. The optical assembly 112 is positioned in the mechanical positioning device (e.g., pins 250) connected to the base module and generally aligned with the semiconductor laser and the wavelength conversion device.

Thereafter, the optical package is powered on and an alignment routine is performed under the control of the controller to locate the waveguide portion of the wavelength conversion device under the control of the controller to generally establish beam alignment in the x-y plane as discussed hereinabove. Once the waveguide is located, the optical assembly 112 is moved along the z-axis while the MEMS-actuated mirror performs adaptive waveguide alignment until optimum coupling is achieved (e.g., the output of the wavelength conversion device is optimized and/or a desired output intensity of the wavelength conversion device is reached, including, without limitation, maximum output intensity). After peak coupling is achieved, the optical assembly 112 is fixed into place with adhesive or by welding or soldering. The signal used to drive the MEMS-actuated mirror is then optimized through feedback control until a minimal MEMS-actuated mirror drive condition (e.g., minimum power condition) is achieved. Finally, the fold mirror is permanently fixed in place using conventional fixation techniques such as adhesive, solder or other similar techniques.

For the various methods of assembly and alignment described herein, it should be understood that minor (e.g., 1-5 μm) deviations in component placement may occur due to the fixation methods employed. These deviations may result in small angular changes of various components with respect to the semiconductor laser and the wavelength conversion device. Such deviations may be easily accommodated for by using the adaptive alignment capabilities of the MEMS-actuated mirror and controller. These adaptive alignment techniques and algorithms permit the rapid acquisition of the optical alignment and also the rapid adjustment of the position of the optical assembly.

It should now be understood that the output beam of the semiconductor laser of the optical packages described herein may be quickly and efficiently aligned and focused into the waveguide portion of the wavelength conversion device using the mechanical positioning device to adjust the position of the optical assembly. Further the methods of assembling and aligning optical packages described herein are suitable for efficiently constructing and aligning a beam spot of a semiconductor laser with a waveguide portion of a wavelength conversion device. The alignment methods described herein are particularly suited for performing the initial alignment of the beam with the wavelength conversion device during assembly of the optical package. However, it should be understood that the alignment method may also be used to maintain alignment or perform realignment of the beam spot with the wavelength conversion device during operation of the optical package or at any time during the life-cycle of the package.

It is contemplated that the methods of the present invention may be applicable to color image-forming laser projection systems, laser-based displays such as heads-up displays in automobiles, or any laser application where optical alignment and/or wavelength tuning are issues. It is further contemplated that the alignment methods discussed herein will have utility in conjunction with a variety of semiconductor lasers, including but not limited to DBR and DFB lasers, Fabry-Perot lasers, and many types of external cavity lasers.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided such modifications and variations come within the scope of the appended claims and their equivalents.

It is noted that terms like "preferably," "commonly," and "typically," if utilized herein, should not be read to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For purposes of describing and defining the present invention it is noted that the terms "substantially" and "approximately" may be utilized herein to represent the inherent degree of uncertainty that may be attributed to any quantitative comparison, value, measurement, or other representation. The terms "substantially" and "approximately" may also be utilized herein to represent the degree by which a quantitative representation may vary from a stated reference without resulting in a change in the basic function of the subject matter at issue.

It is noted that recitations herein of a component being "programmed" in a particular way, "configured" or "programmed" to embody a particular property or function, are structural recitations as opposed to recitations of intended use. More specifically, the references herein to the manner in which a component is "programmed" or "configured" denotes an existing physical conditions of the component and, as such, is to be taken as a definite recitation of the structural characteristics of the component. For example, references herein to a optical assembly and an adjustable optical component being "configured" to direct a laser beam in a particular manner denotes an existing physical condition of the optical assembly and the adjustable optical component and, as such, is to be taken as a definite recitation of the structural characteristics of the optical assembly and the adjustable optical component.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed:

1. An optical package comprising a semiconductor laser, a wavelength conversion device, a MEMS-actuated mirror, an optical assembly, a mechanical positioning device and a base module, wherein:

the wavelength conversion device comprises a waveguide portion;

the semiconductor laser, the wavelength conversion device and the MEMS-actuated mirror are oriented on the base module to form a folded optical pathway between an output of the semiconductor laser and an input of the wavelength conversion device such that an output beam of the semiconductor laser may be reflected by the MEMS-actuated mirror into the waveguide portion of the wavelength conversion device;

the MEMs-actuated mirror is operable to scan the output beam of the semiconductor laser over the input of the wavelength conversion device; and the optical assembly is located in the mechanical positioning device and the mechanical positioning device is disposed on the base module along the folded optical pathway such that the output beam of the semiconductor laser passes through the optical assembly and is reflected back through the optical assembly and into the waveguide portion of the wavelength conversion device, wherein a position of the optical assembly along the folded optical pathway may be adjusted with the mechanical positioning device such that the output beam of the semiconductor laser is focused into the waveguide portion of the wavelength conversion device.

2. The optical package of claim 1 wherein the base module comprises electrical interconnects and the MEMS-actuated mirror is integrated into the base module and connected to the electrical interconnects.

3. The optical package of claim 1 wherein the MEMS-actuated mirror is oriented on the base module such that a normal to a surface of the MEMS-actuated mirror is parallel to an optical axis of the semiconductor laser and an optical axis of the wavelength conversion device.

4. The optical package of claim 3 wherein the mechanical positioning device comprises an optical assembly holder in which the optical assembly is positioned, wherein the optical assembly holder is attached to the MEMS-actuated mirror.

5. The optical package of claim 4 wherein the optical assembly holder comprises at least one positioning feature; and
the base module comprises a plurality of locating features corresponding to the at least one positioning feature of the optical assembly holder such that the optical assembly holder may be adjustably positioned along the base module.

6. The optical package of claim 4 wherein the optical assembly is integrally formed with the optical assembly holder.

7. The optical package of claim 3 wherein the mechanical positioning device comprises pins, a v-groove or a slot into which the optical assembly may be inserted and adjustably positioned.

8. The optical package of claim 1 wherein the MEMS-actuated mirror is oriented on the base module such that a normal to a surface of the MEMS-actuated mirror is perpendicular to the optical axis of the semiconductor laser and the optical axis of the wavelength conversion device; and
the optical package further comprises a fold mirror disposed along the folded optical pathway between the optical assembly and the MEMS-actuated mirror, wherein the fold mirror is oriented such that the output beam of the semiconductor laser is redirected by the fold mirror onto the MEMS-actuated mirror, reflected back onto the fold mirror and redirected back through the optical assembly and into the waveguide portion of the wavelength conversion device.

9. The optical package of claim 8 wherein the mechanical positioning device comprises an optical assembly holder in which the optical assembly is positioned and the optical assembly holder is positioned on the base module over the MEMS-actuated mirror.

10. The optical package of claim 9 wherein the optical assembly is integrally formed with the optical assembly holder.

11. The optical package of claim 9 wherein the fold mirror is positioned on the optical assembly holder.

12. The optical package of claim 9 wherein the fold mirror is integral with the optical assembly holder.

13. The optical package of claim 9 wherein the optical assembly holder comprises at least one positioning feature; and
the base module comprises a plurality of locating features corresponding to the at least one positioning feature of the optical assembly holder such that the optical assembly holder may be adjustably positioned along the base module.

14. The optical package of claim 8 wherein the surface of the fold mirror is curved.

15. The optical package of claim 8 further comprising a package cover and the fold mirror is integrally formed with the package cover.

16. The optical package of claim 8 further comprising a package cover and the fold mirror is attached to the package cover.

17. The optical package of claim 8 wherein the mechanical positioning device comprises pins, a v-groove or a slot into which the optical assembly may be inserted and adjustably positioned.

* * * * *